United States Patent
Yang

(10) Patent No.: US 8,383,447 B2
(45) Date of Patent: Feb. 26, 2013

(54) REVERSE IMAGE SENSOR MODULE AND METHOD FOR MANUFACTURING THE SAME

(75) Inventor: Seung Taek Yang, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/412,821

(22) Filed: Mar. 6, 2012

(65) Prior Publication Data

US 2012/0171803 A1 Jul. 5, 2012

Related U.S. Application Data

(62) Division of application No. 12/647,648, filed on Dec. 28, 2009, now Pat. No. 8,154,098.

(30) Foreign Application Priority Data

Nov. 20, 2009 (KR) .................. 10-2009-0112629

(51) Int. Cl.
  *H01L 31/18* (2006.01)
(52) U.S. Cl. ............ 438/65; 438/59; 438/64; 438/70
(58) Field of Classification Search .......... 257/233, 257/292, 431–466; 438/59, 64, 69, 70
  See application file for complete search history.

(56) References Cited

U.S. PATENT DOCUMENTS

| 7,187,017 | B2 | 3/2007 | Sawase et al. |
| 2004/0005729 | A1 | 1/2004 | Abe et al. |
| 2005/0139943 | A1 | 6/2005 | Kanbe |
| 2008/0102554 | A1 | 5/2008 | Abe et al. |
| 2009/0147101 | A1 | 6/2009 | Tatani et al. |
| 2009/0256226 | A1 | 10/2009 | Tatani et al. |
| 2010/0032659 | A1 | 2/2010 | Yoshida |
| 2010/0181637 | A1 | 7/2010 | Harada et al. |
| 2011/0121420 | A1 | 5/2011 | Yang |

FOREIGN PATENT DOCUMENTS

| JP | 2005-501421 A | 1/2005 |
| KR | 1020080004183 A | 1/2008 |
| WO | 03/019668 A1 | 3/2003 |

OTHER PUBLICATIONS

USPTO RR mailed Aug. 8, 2011 in connection with U.S. Appl. No. 12/647,648.
USPTO NOA mailed Dec. 8, 2011 in connection with U.S. Appl. No. 12/647,648.

*Primary Examiner* — Mamadou Diallo
(74) *Attorney, Agent, or Firm* — Ladas & Parry LLP

(57) ABSTRACT

A reverse image sensor module includes first and second semiconductor chips, and first and second insulation layers. The first semiconductor chip includes a first semiconductor chip body having a first surface and a second surface facing away from the first surface, photodiodes disposed on the first surface, and a wiring layer disposed on the second surface and having wiring lines electrically connected to the photodiodes and bonding pads electrically connected to the wiring lines. The second semiconductor chip includes a second semiconductor chip body having a third surface facing the wiring layer, and through-electrodes electrically connected to the bonding pads and passing through the second semiconductor chip body. The first insulation layer is disposed on the wiring layer, and the second insulation layer is disposed on the third surface of the second semiconductor chip body facing the first insulation layer and is joined to the first insulation layer.

8 Claims, 5 Drawing Sheets

REVERSE IMAGE SENSOR MODULE AND METHOD FOR MANUFACTURING THE SAME

CROSS-REFERENCE TO RELATED APPLICATIONS

The present application claims priority to Korean patent application number 10-2009-0112629 filed on Nov. 20, 2009, which is incorporated herein by reference in its entirety.

BACKGROUND OF THE INVENTION

The present invention relates to an image sensor module, and more particularly, to a reverse image sensor module.

In general, an image sensor module produces digital images by detecting externally incident light. The image sensor module can be mounted onto digital cameras, notebook computers, etc. Moving pictures or still images can be realized using the image sensor module.

The image sensor module includes a semiconductor chip which has image sensors, wiring lines which are disposed on the semiconductor chip and are electrically connected to the image sensors, and through-electrodes which pass through the semiconductor chip and are electrically connected to the wiring lines.

The conventional image sensor module suffers from defects in that, since the photodiodes are disposed under the wiring lines, travel of light to be incident on the photodiodes is impeded by the presence of the wiring lines, and therefore the quality of an image is likely to deteriorate.

Also, the conventional image sensor module has a problem in that, because through-holes should be defined in the semiconductor chip and through-electrodes should be formed in the through-holes, the image sensor module is susceptible to breakage and damage.

BRIEF SUMMARY OF THE INVENTION

Embodiments of the present invention include a reverse image sensor module which maximizes the quantity of light incident on a photodiode by preventing loss of the quantity of light incident on photodiodes caused by the presence of a wiring layer connected to the photodiodes and disposed on the photodiodes, and a method for manufacturing the same.

In one embodiment of the present invention, a reverse image sensor module comprises a first semiconductor chip including a first semiconductor chip body having a first surface and a second surface which faces away from the first surface, photodiodes formed on the first surface, and a wiring layer disposed on the second surface and having wiring lines which are electrically connected to the photodiodes and bonding pads which are electrically connected to the wiring lines; a second semiconductor chip including a second semiconductor chip body having a third surface which faces the wiring layer, and through-electrodes electrically connected to the bonding pads and passing through the second semiconductor chip body; a first insulation layer disposed on the wiring layer; and a second insulation layer disposed on the third surface of the second semiconductor chip body which faces the first insulation layer and joined to the first insulation layer.

Each of the first and second insulation layers may comprise any one of an oxide layer and a polymer layer.

Portions of the second insulation layer may be interposed between the through-electrodes and inner surfaces which are created by defining through-holes in the second semiconductor chip body through which the through-electrodes pass.

Each of the bonding pads and the through-electrodes may contain copper.

The reverse image sensor module may further comprise color filters disposed on the first surface and covering the respective photodiodes; and micro lenses disposed on the respective color filters.

The reverse image sensor module may further comprise a separating member disposed along edges of the first surface and having a height greater than a thickness of the micro lenses; and a transparent substrate disposed on the separating member.

The reverse image sensor module may further comprise color filters disposed on the first surface and covering the respective photodiodes; a transparent substrate disposed on the color filters and having grooves defined at positions corresponding to the color filters; and micro lenses disposed in the grooves, having a refractive index different from that of the transparent substrate, and contacting the photodiodes.

The second semiconductor chip may further include passive elements which are disposed on the third surface, and the passive elements may be electrically connected to the through-electrodes.

The second semiconductor chip may comprise a bare semiconductor chip.

The through-electrodes may include conductive impurities which are ion-implanted into the second semiconductor chip body at a high doping concentration and connection pads which are disposed on both ends of the through-electrodes and contain a metal.

One end of the individual through-electrodes which faces the pad may protrude from the second semiconductor chip body, and the pads may have grooves into which protruding ends of the through-electrodes are fitted.

In another embodiment of the present invention, a method for manufacturing a reverse image sensor module comprises the steps of forming a first semiconductor chip including photodiodes disposed on a first surface of a first semiconductor chip body, a wiring layer disposed on a second surface of the first semiconductor chip body facing away from the first surface and having wiring lines which are electrically connected to the photodiodes and pads which are electrically connected to the wiring lines, and a first insulation layer covering the wiring layer; forming a second semiconductor chip including through-electrodes formed in a second semiconductor chip body to correspond to the pads and pass through the second semiconductor chip body, and a second insulation layer formed between the through-electrodes and the second semiconductor chip body and on a third surface of the second semiconductor chip body facing the second surface of the first semiconductor chip; and joining the first and second insulation layers together.

In the step of forming the first and second insulation layers, the first and second insulation layers may comprise any one of silicon oxide layers and polymer layers and may be joined together through application of heat and pressure.

The step of forming the through-electrodes may comprise the steps of defining blind vias to extend from the third surface of the second semiconductor chip body toward a fourth surface which faces away from the third surface; forming the second insulation layer on the third surface and on inner surfaces of the second semiconductor chip body which are created by defining the blind vias; and forming the through-electrodes containing a metal in the blind vias.

After the step of joining the first and second semiconductor chips, the method may further comprise the steps of grinding the first semiconductor chip and exposing the photodiodes; and grinding the second semiconductor chip and exposing the through-electrodes.

The step of forming the through-electrodes may comprise the steps of ion-implanting conductive impurities at a high doping concentration into the second semiconductor chip body at positions corresponding to the pads; annealing the second semiconductor chip ion-implanted with the conductive impurities; and forming connection patterns on both ends of the through-electrodes containing the conductive impurities.

The method may further comprise the step of forming color filters on the first surface of the first semiconductor chip to cover the respective photodiodes; and forming micro lenses on the color filters.

The method may further comprise the steps of forming a band-shaped separating member along edges of the first surface to have a height greater than a thickness of the micro lenses; and disposing a transparent substrate on the separating member.

The method may further comprise the step of forming a transparent substrate using a flowable transparent substance which has a refractive index different from that of the micro lenses, to cover the color filters and the micro lenses.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
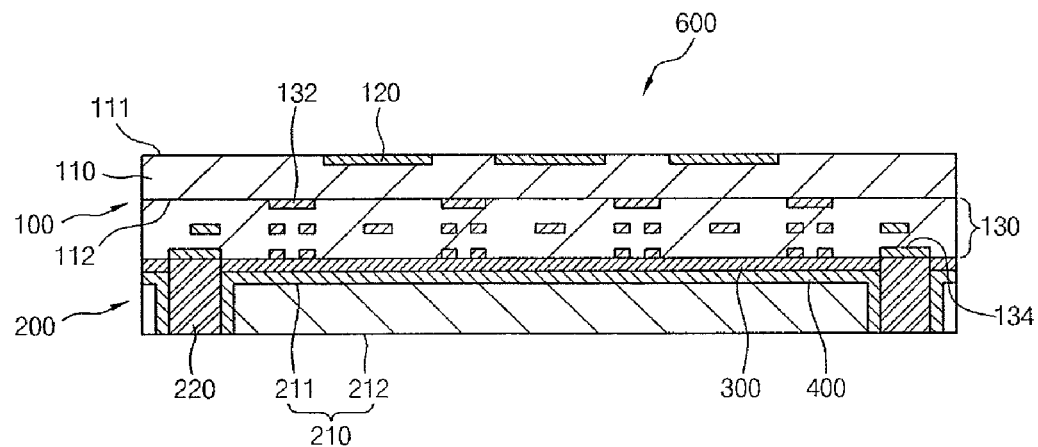
FIG. 1 is a cross-sectional view showing a reverse image sensor module in accordance with an embodiment of the present invention.

FIG. 1 is a cross-sectional view showing a reverse image sensor module in accordance with an embodiment of the present invention.

Referring to FIG. 1, a reverse image sensor module 600 includes a first semiconductor chip 100, a second semiconductor chip 200, a first insulation layer 300, and a second insulation layer 400.

The first semiconductor chip 100 includes a first semiconductor chip body 110, photodiodes 120, and a wiring layer 130.

The first semiconductor chip body 110 may have, for example, the shape of a rectangular hexahedral plate. The first semiconductor chip body 110 has a first surface 111 and a second surface 112 which faces away from the first surface 111. The photodiodes 120 are disposed on the first surface 111 of the first semiconductor chip body 110. The photodiodes 120 function to generate electrical signals corresponding to quantities of light externally incident on them.

The wiring layer 130 is disposed on the second surface 112 of the first semiconductor chip body 110. The wiring layer 130 includes wiring lines 132, which are electrically connected to the photodiodes 120, and pads 134, which are electrically connected to the wiring lines 132. In an embodiment, the pads 134 can contain copper. The wiring layer 130 can include a plurality of thin film transistors which are connected to the wiring lines 132, and the pads 134 are electrically connected to the second semiconductor chip 200, which will be described later in detail.

In the embodiment, since the photodiodes 120 are disposed on the first surface 111 of the first semiconductor chip body 110 and the wiring layer 130 is disposed on the second surface 112 of the first semiconductor chip body 110, the wiring layer 130 can be formed on the second surface 112 of the first semiconductor chip body 110 irrespective of positions of the photodiodes 120.

In the embodiment, since the photodiodes 120 and the wiring layer 130 are disposed on the first and second surfaces 111 and 112 respectively of the first semiconductor chip body 110, loss of light incident on the photodiodes 120, which is conventionally caused by the presence of the wiring layer 130, is prevented, whereby clearer images can be obtained from the reverse image sensor module 600.

The second semiconductor chip 200 includes a second semiconductor chip body 210 and through-electrodes 220.

The second semiconductor chip 210 may have, for example, the shape of a rectangular hexahedral plate. For example, the second semiconductor chip body 210 can have substantially the same shape and size as the first semiconductor chip body 110. In the embodiment, the second semiconductor chip body 210 can comprise a bare silicon substrate. The second semiconductor chip body 210 has a third surface 211 which faces the first semiconductor chip 100 and a fourth surface 212 which faces away from the third surface 211.

The through-electrodes 220 pass through the third surface 211 and the fourth surface 212 of the second semiconductor chip body 210. The through-electrodes 220 are placed at positions corresponding to the pads 134 of the wiring layer 130 of the first semiconductor chip 100. The through-electrodes 220 may have, for example, a column-like shape. The through-electrodes 220 can contain, for example, copper. In an embodiment, the through-electrodes 220 protrude from the third surface 211 by a predetermined height. Further, in an embodiment the protruding height of the through-electrodes 220 can be substantially equal to the sum of the thicknesses of the first and second insulation layers 300 and 400 which will be described later in detail.

The first and second semiconductor chips 100 and 200 are arranged so that the third surface 211 of the second semiconductor chip body 210 and the wiring layer 130 of the first semiconductor chip 100 face each other.

The first insulation layer 300 is disposed on the lower surface of the wiring layer 130 of the first semiconductor chip 100, and the second insulation layer 400 is disposed on the third surface 211 of the second semiconductor chip 200. The second insulation layer 400 has openings which expose the through-electrodes 220 of the second semiconductor chip 200. That is, the second insulation layer has openings through which the through-electrodes 220 pass.

In an embodiment, the first insulation layer 300 can comprise an oxide layer containing an oxide or a polymer layer containing a polymer. The second insulation layer 400 can comprise an oxide layer containing an oxide or a polymer layer containing a polymer.

In an embodiment, the first insulation layer 300 and the second insulation layer 400 are bonded to each other through application of heat and/or pressure without using a separate adhesive, and due to this fact, the pads 134 of the first semiconductor chip 100 and the through-electrodes 220 of the second semiconductor chip 200 are electrically connected together.

In an embodiment, portions of the second insulation layer 400 are interposed between the through-electrodes 220 of the second semiconductor chip 200 and the inner surfaces of the second semiconductor chip body 210 which are formed by through-holes defined in the second semiconductor chip body 210 for forming the through-electrodes 220.

Due to the fact that the wiring layer 130 is disposed facing down as shown in FIG. 1, it is possible to prevent paths of light to be incident on the photodiodes 120 from being impeded by the presence of the wiring layer 130. Also, since the through-electrodes 220 are not formed in the first semiconductor chip 100 formed with the photodiodes 120, it is possible to prevent the first semiconductor chip 100 from being damaged during formation of the through-electrodes 220.

Figure 2:
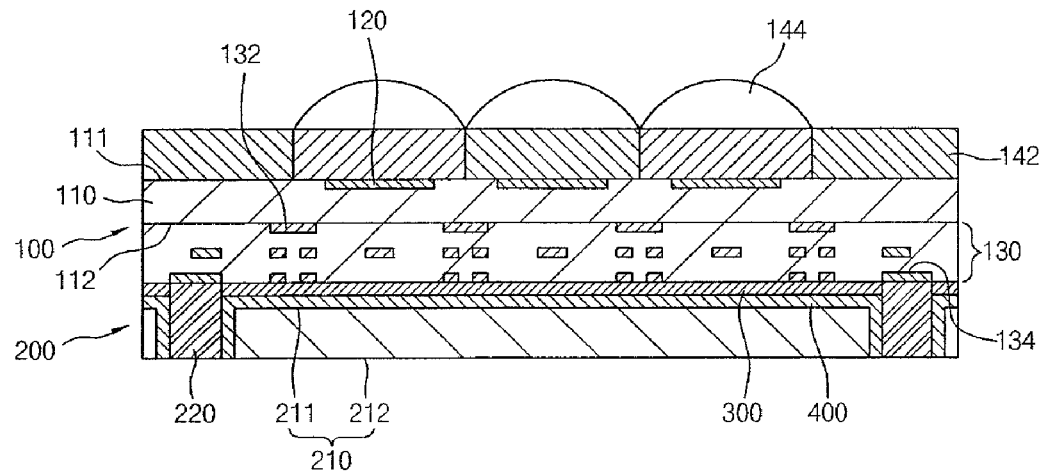
FIG. 2 is a cross-sectional view showing a reverse image sensor module in accordance with another embodiment of the present invention.

FIG. 2 is a cross-sectional view showing a reverse image sensor module in accordance with another embodiment of the present invention. The reverse image sensor module shown in FIG. 2 has substantially the same construction as the reverse image sensor module shown in FIG. 1, except for the inclusion of color filters and micro lenses. Therefore, descriptions for the same component parts will be omitted for brevity, and the same technical terms and the same reference numerals will be used to refer to the same or like component parts.

Referring to FIG. 2, a reverse image sensor module 600 includes a first semiconductor chip 100, a second semiconductor chip 200, a first insulation layer 300, a second insulation layer 400, color filters 142, and micro lenses 144.

The color filters 142 are disposed on the first surface 111 of the first semiconductor chip body 110 of the first semiconductor chip 100. In an embodiment, the color filters 142 include red color filters for producing red light by filtering white light, blue color filters for producing blue light by filtering white light, and green color filters for producing green light by filtering white light. The respective color filters 142 are placed at positions that correspond to the respective photodiodes 120 which are formed on the first surface 111 of the first semiconductor chip body 110.

The micro lenses 144 are disposed on the respective color filters 142 which correspond to the respective photodiodes 120. The micro lenses 144 have curved surfaces to collect external light.

Figure 3:
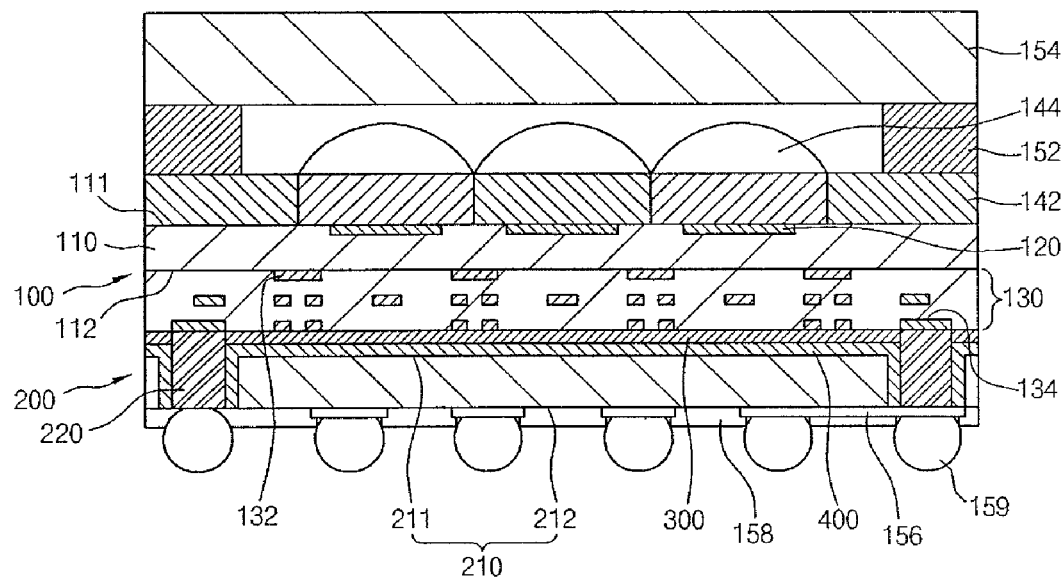
FIG. 3 is a cross-sectional view showing a reverse image sensor module in accordance with another embodiment of the present invention.

FIG. 3 is a cross-sectional view showing a reverse image sensor module in accordance with another embodiment of the present invention. The reverse image sensor module shown in FIG. 3 has substantially the same construction as the reverse image sensor module shown in FIG. 2, except for the inclusion of a separating member, a transparent substrate, re-distribution lines, solder resists, and solder balls. Therefore, descriptions for the same component parts will be omitted for brevity, and the same technical terms and the same reference numerals will be used to refer to the same or like component parts.

Referring to FIG. 3, a reverse image sensor module 600 includes a first semiconductor chip 100, a second semiconductor chip 200, a first insulation layer 300, a second insulation layer 400, color filters 142, micro lenses 144, a separating member 152, a transparent substrate 154, re-distribution lines 156, solder resists 158, and solder balls 159.

The separating member 152 is disposed on the color filters 142 which are disposed on the first semiconductor chip 100. The separating member 152 has, for example, a band-like shape and is located along the periphery of the color filters 142. For example, the separating member 152 has a thickness that is greater than the thickness of the micro lenses 144, by which the micro lenses 144 are separated from the transparent substrate 154 which will be described below. In an embodiment, the separating member 152 can comprise an adhesive substance or an adhesive member which contains the adhesive substance.

The transparent substrate 154 is disposed on and attached to the separating member 152. The transparent substrate 154 and the separating member 152 function to separate the color filters 142 and the micro lenses 144 from external circumstances and prevent the color filters 142 and the micro lenses 144 from being polluted by pollutants such as external particles.

In an embodiment, the transparent substrate 154 can comprise a transparent glass substrate, a transparent quartz substrate, or a transparent synthetic resin substrate.

Figure 4:
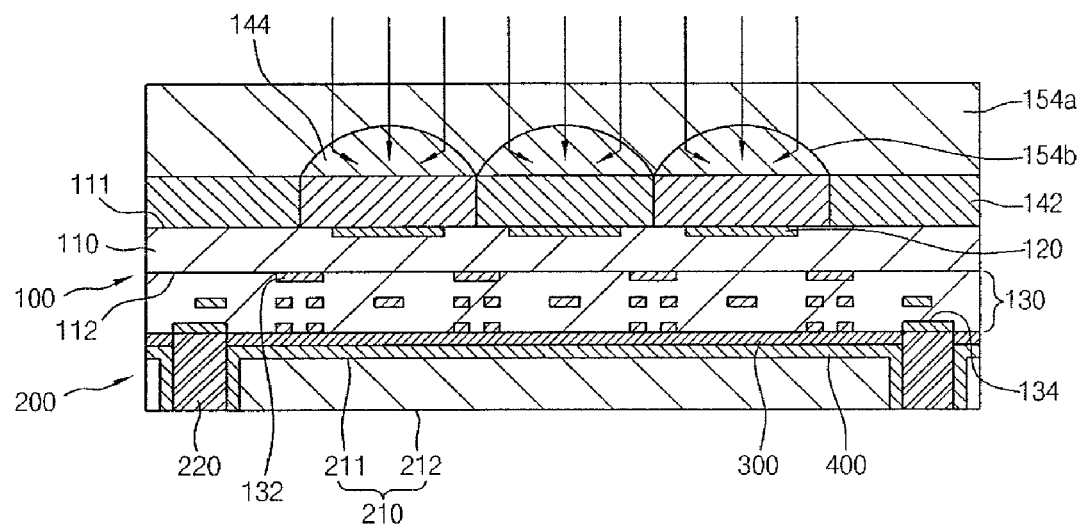
FIG. 4 is a cross-sectional view showing a reverse image sensor module in accordance with another embodiment of the present invention.

FIG. 4 is a cross-sectional view showing a reverse image sensor module in accordance with another embodiment of the present invention. The reverse image sensor module shown in FIG. 4 has substantially the same construction as the reverse image sensor module shown in FIG. 2, except for the inclusion of a transparent substrate. Therefore, descriptions for the same component parts will be omitted for brevity, and the same technical terms and the same reference numerals will be used to refer to the same or like component parts.

Referring to FIG. 4, a reverse image sensor module 600 includes a first semiconductor chip 100, a second semiconductor chip 200, a first insulation layer 300, a second insulation layer 400, color filters 142, micro lenses 144, and a transparent substrate 154*a*.

The transparent substrate 154*a* is disposed on the color filters 142. The surface of the transparent substrate 154*a* which faces the color filters 142 is formed with receiving grooves 154*b* for receiving the respective micro lenses 144 disposed on the color filters 142. The sectional shape of the receiving grooves 154*b* can correspond to the sectional shape of the micro lenses 144, and due to this fact, the micro lenses 144 directly contact the transparent substrate 154*a*.

In an embodiment, in order to ensure that light incident through the transparent substrate 154*a* is collected by the micro lenses 144, the transparent substrate 154*a* has a first refractive index, and the micro lenses 144 have a second refractive index different from the first refractive index.

In the embodiment, due to the fact that the receiving grooves 154*b* for receiving the micro lenses 144 are defined in the transparent substrate 154*a*, the overall height and volume of the reverse image sensor module 600 can be decreased.

Figure 5:
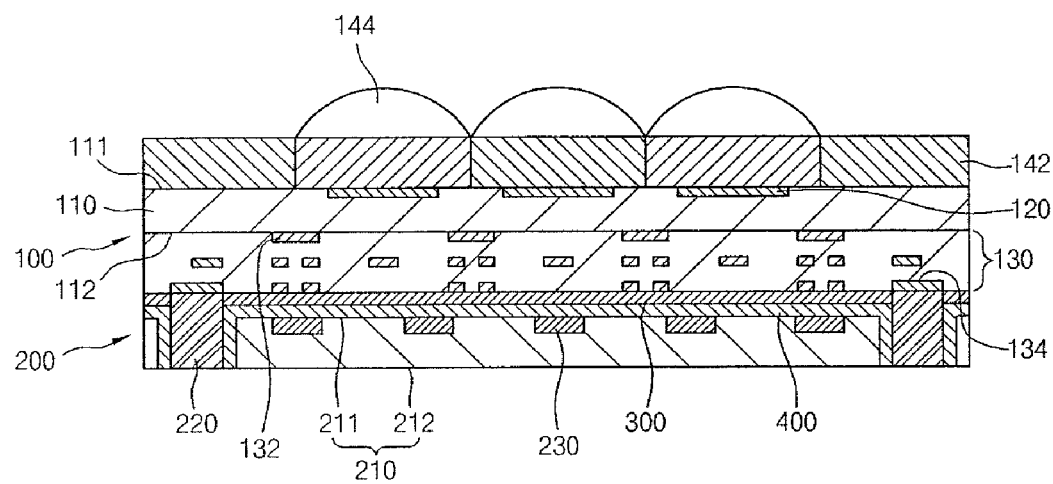
FIG. 5 is a cross-sectional view showing a reverse image sensor module in accordance with another embodiment of the present invention.

FIG. 5 is a cross-sectional view showing a reverse image sensor module in accordance with another embodiment of the present invention. The reverse image sensor module shown in FIG. 5 has substantially the same construction as the reverse image sensor module shown in FIG. 2, except for the inclusion of passive elements. Therefore, descriptions for the same component parts will be omitted herein, and the same technical terms and the same reference numerals will be used to refer to the same or like component parts.

Referring to FIG. 5, a reverse image sensor module 600 includes a first semiconductor chip 100, a second semiconductor chip 200, a first insulation layer 300, a second insulation layer 400, color filters 142, micro lenses 144, and passive elements 230.

In the embodiment, when the second semiconductor chip 200 comprises a silicon substrate, the passive elements 230 may be formed on the third surface 211 and/or the fourth surface 212 of the second semiconductor chip 200.

In an embodiment, examples of the passive elements 230 can include thin film transistors, diodes, inductors, resistors, etc. The passive elements 230 can be formed through a thin film process.

The input and output terminals (not shown) of the passive elements 230 are electrically connected to the through-electrodes 220 which are formed through the second semiconductor chip 200. Alternatively, the input and output terminals of the passive elements 230 can be electrically connected to the wiring lines 132 of the wiring layer 130 of the first semiconductor chip 100.

In the embodiment, in such a case that the passive elements 230 are formed in the semiconductor chip 200 comprising a silicon substrate, the size and/or the volume of the reverse image sensor module 600 can be decreased.

Figure 6:
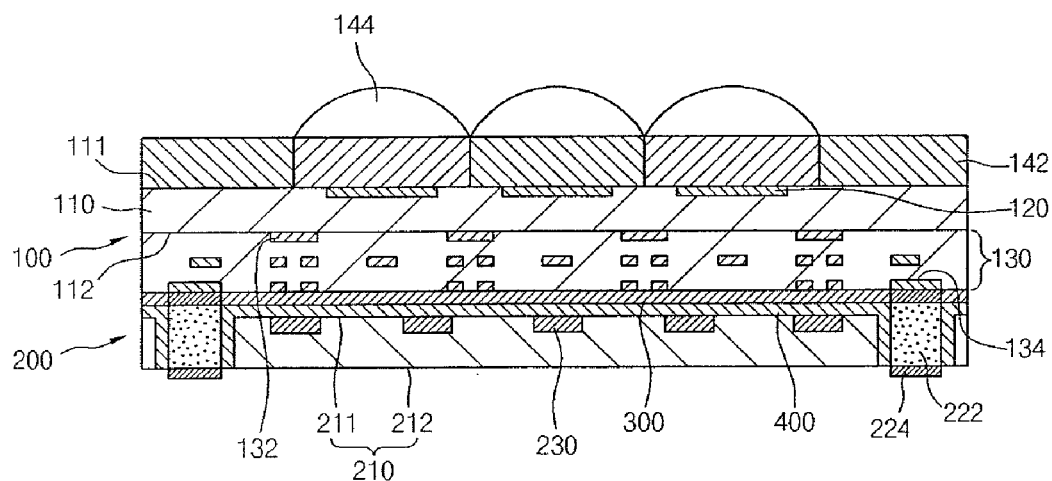
FIG. 6 is a cross-sectional view showing a reverse image sensor module in accordance with another embodiment of the present invention.

FIG. 6 is a cross-sectional view showing a reverse image sensor module in accordance with another embodiment of the present invention. The reverse image sensor module shown in FIG. 6 has substantially the same construction as the reverse image sensor module shown in FIG. 5, except for the through-electrodes and the connection pads. Therefore, descriptions for the same component parts will be omitted herein, and the same technical terms and the same reference numerals will be used to refer to the same or like component parts.

Referring to FIG. 6, a reverse image sensor module 600 includes a first semiconductor chip 100, a second semiconductor chip 200, a first insulation layer 300, a second insulation layer 400, color filters 142, and micro lenses 144.

The second semiconductor chip 200 includes through-electrodes 222 which are formed at positions corresponding to the pads 134 of the first semiconductor chip 100 and connection pads 224 which are disposed on both ends of the individual through-electrodes 222. The through-electrodes 222 contain conductive impurities which are ion-implanted at a high doping concentration into the second semiconductor chip 200 comprising a silicon substrate. The connection pads 224 contain a metal and are disposed on both ends of the through-electrodes 222. The connection pads 224 directly contact the pads 134 of the first semiconductor chip 100.

In the embodiment, due to the fact that the through-electrodes 222 contain the conductive impurities ion-implanted at the high doping concentration in place of copper, the structure of the second semiconductor chip 200 can be simplified, and breakage of and damage to the second semiconductor chip 200 can be significantly lessened.

Further, since the through-electrodes 222 are formed in the second semiconductor chip 200 rather than the first semiconductor chip 100 formed with the photodiodes 120, the through-electrodes 222 containing the conductive impurities can be formed in the second semiconductor chip 200 through an ion-implantation process that requires a high processing temperature, whereby the manufacturing procedure and the structure of the through-electrodes 222 can be further simplified.

Figure 7:
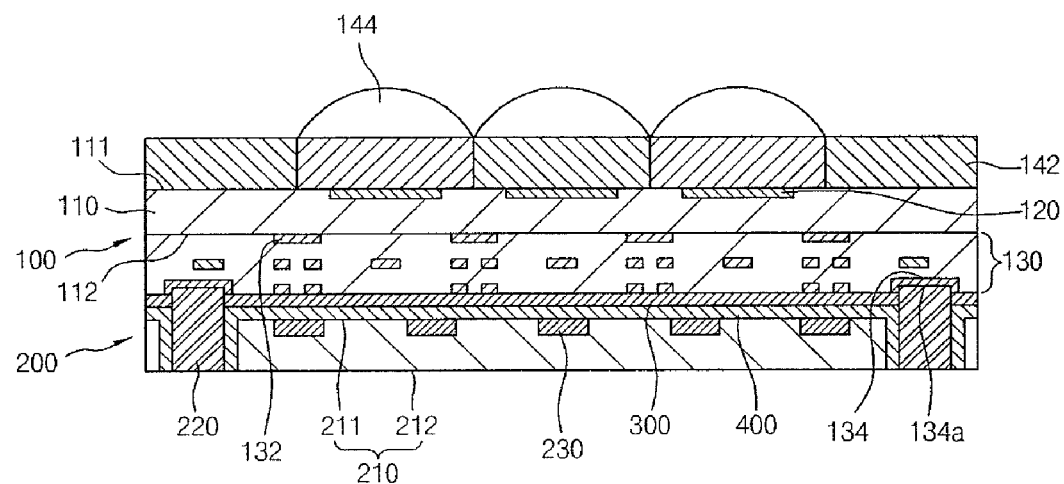
FIG. 7 is a cross-sectional view showing a reverse image sensor module in accordance with another embodiment of the present invention.

FIG. 7 is a cross-sectional view showing a reverse image sensor module in accordance with another embodiment of the present invention. The reverse image sensor module shown in FIG. 7 has substantially the same construction as the reverse image sensor module shown in FIG. 2, except the pads of a first semiconductor chip. Therefore, descriptions for the same component parts will be omitted for brevity, and the same technical terms and the same reference numerals will be used to refer to the same or like component parts.

Referring to FIG. 7, a reverse image sensor module 600 includes a first semiconductor chip 100, a second semiconductor chip 200, a first insulation layer 300, a second insulation layer 400, color filters 142, and micro lenses 144.

Of the ends of the through-electrodes 220 of the second semiconductor chip 200, the ends corresponding to the third surface 211 protrude beyond the upper surface of the second insulation layer 400, and the pads 134 of the first semiconductor chip 100 which correspond to the through-electrodes 220 are defined with grooves 134a. The protruding ends of the through-electrodes 220 are fitted into the grooves 134a of the pads 134. Due to this fact, the through-electrodes 220 are physically and electrically connected to the pads 134. A conductive adhesive or the like can be interposed between the pads 134 and the through-electrodes 220.

Figure 8:
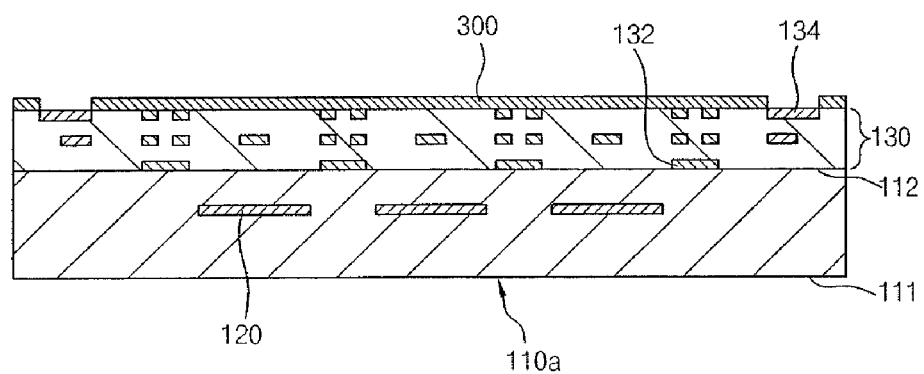
FIGS. 8 through 10 are cross-sectional views shown for illustrating a method for manufacturing a reverse image sensor module in accordance with another embodiment of the present invention.
Figure 9:
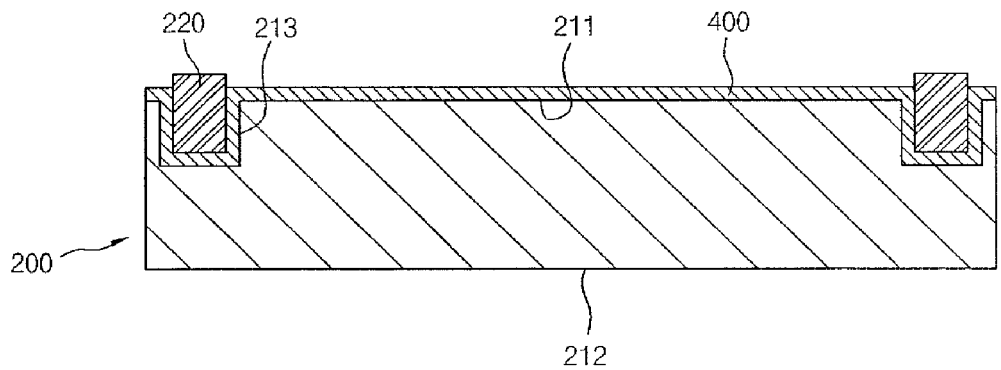
Figure 10:
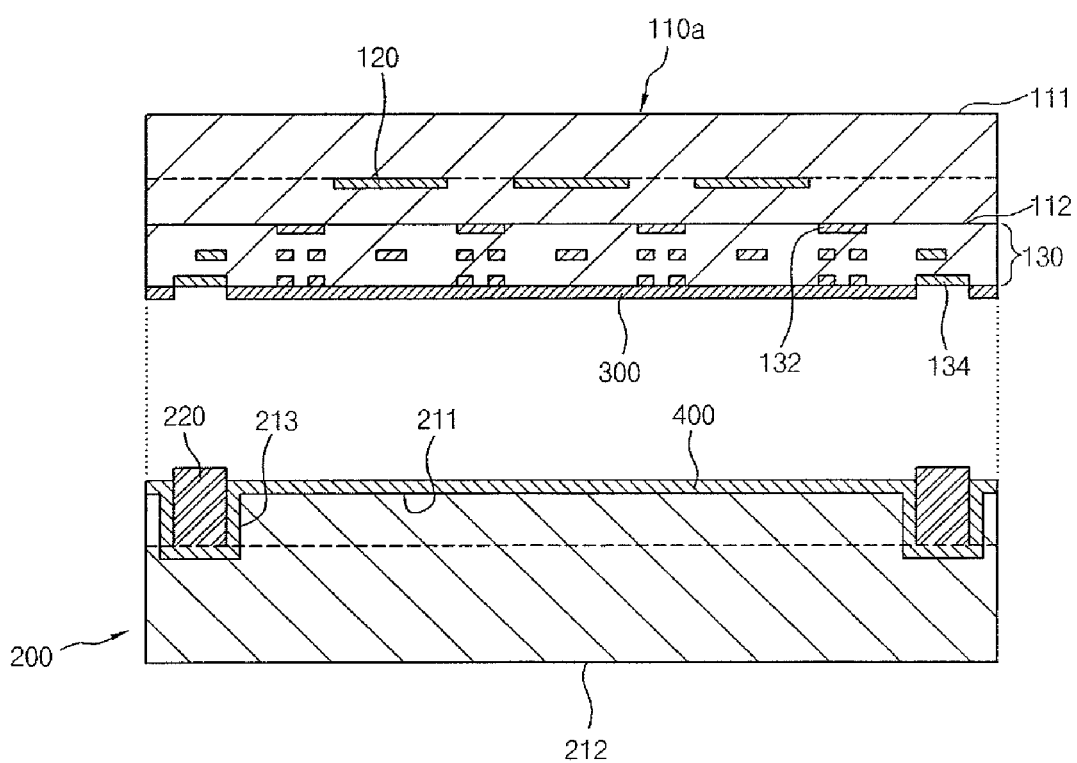

FIGS. 8 through 10 are cross-sectional views shown for illustrating a method for manufacturing a reverse image sensor module in accordance with another embodiment of the present invention.

Referring to FIG. 8, in order to manufacture a reverse image sensor module, steps for manufacturing a first semiconductor chip 100 are conducted first.

In order to manufacture the first semiconductor chip 100, photodiodes 120 are formed inside or on a first surface 111 of a first preliminary semiconductor chip body 110a which has a substantial thickness. The photodiodes 120 function to generate electrical signals corresponding to quantities of light externally incident on them.

After the photodiodes 120 are formed inside or on the first surface 111 of the first preliminary semiconductor chip body 110a, a wiring layer 130, which has a plurality of thin film transistors (not shown) electrically connected to the photodiodes 120, wiring lines 132, and pads 134 electrically connected to the wiring lines 132, is formed on a second surface 112 of the first preliminary semiconductor chip body 110a. The wiring layer 130 can be formed to correspond to the photodiodes 120.

In an embodiment, the wiring lines 132 and the pads 134 which are included in the wiring layer 130 can be formed of, for example, copper.

After the wiring layer 130 is formed, a first insulation layer 300 can be formed on the wiring layer 130. The first insulation layer 300 can comprise, for example, an oxide layer or a polymer layer which can be attached to the wiring layer 300 through application of heat and/or pressure.

Referring to FIG. 9, in order to manufacture a second semiconductor chip 200, first, a third surface 211 of a second preliminary semiconductor chip body is defined with blind vias 213 which have a depth shallower than the thickness of the second preliminary semiconductor chip body. In the embodiment, the third surface 211 faces the second surface 112 of the first semiconductor chip 100, and the blind vias 213 are defined at positions corresponding to the respective pads 134 of the first semiconductor chip 100.

After the blind vias 213 are defined, a second insulation layer 400 can be formed on the third surface 211 of the second semiconductor chip 200. The second insulation layer 400 can comprise, for example, an oxide layer or a polymer layer which can be attached to the second semiconductor chip 200 through application of heat and/or pressure. The second insulation layer 400 may be formed not only on the third surface 211 of the second semiconductor chip 200 but also on the inner surfaces of the second semiconductor chip 200 which are created by defining the blind vias 213.

In an embodiment, the first insulation layer 300 of the first semiconductor chip 100 and the second insulation layer 400 of the second semiconductor chip 200 can comprise oxide layers. Alternatively, in another embodiment the first insulation layer 300 of the first semiconductor chip 100 and the second insulation layer 400 of the second semiconductor chip 200 can comprise polymer layers.

After the second insulation layer 400 is formed on the second semiconductor chip 200, through-electrodes 220 are formed in the blind vias 213 of the second semiconductor chip 200. In the embodiment, the through-electrodes 220 are formed in the blind vias 213 through a plating process. One end of the individual through-electrodes 220 protrudes beyond the third surface 211 of the second semiconductor chip 200 by a predetermined height. In an embodiment, the through-electrodes 220 can contain, for example, copper.

Referring to FIG. 10, the first and second semiconductor chips 100 and 200 are arrange so that the second surface 112 of the first semiconductor chip 100 shown in FIG. 8 and the third surface 211 of the second semiconductor chip 200 shown in FIG. 9 face each other. The first insulation layer 300 of the first semiconductor chip 100 and the second insulation layer 400 of the second semiconductor chip 200 are attached to each other through the application of heat and/or pressure, and due to this fact, the first and second semiconductor chips 100 and 200 can be attached together without using a separate adhesive.

Although it was shown and explained in the embodiment that the formation of the first insulation layer 300 on the first semiconductor chip 100 and the formation of the second insulation layer 400 on the second semiconductor chip 200 are separately implemented, it is conceivable that any one of the first and second insulation layers 300 and 400 can be selectively formed on any one of the first and second semiconductor chips 100 and 200.

After the first and second semiconductor chips 100 and 200 are attached together by the medium of the first and second insulation layers 300 and 400, the first surface 111 of the first semiconductor chip 100 is grinded through a grinding process until the photodiodes 120 are exposed. Also, a fourth surface 212 of the second semiconductor chip 200 is grinded through a grinding process until the through-electrodes 220 are exposed, by which a reverse image sensor module 600 as shown in FIG. 1 is manufactured.

It was shown and explained in the embodiment that the through-electrodes are formed through the plating process after the blind vias are defined and the second insulation layer is formed. Alternatively, in order to form the through-electrodes 220 as shown in FIG. 6, it is conceivable that conductive impurities can be ion-implanted at a high doping concentration at positions on the second semiconductor chip 200 corresponding to the pads 134 of the first semiconductor chip 100, the second semiconductor chip 200 ion-implanted with the conductive impurities can be annealed, and connection patterns can be formed on both ends of the through-electrodes 220 containing the conductive impurities.

Also, in an embodiment, after exposing the photodiodes and through-electrodes by attaching and then grinding the first and second semiconductor chips, as shown in FIG. 2, color filters 142 can be formed on the first surface 111 of the first semiconductor chip 100 to cover the photodiodes 120, and micro lenses 144 can be formed on the color filters 142.

Further, in an embodiment, after the micro lenses 144 are disposed on the color filters 142, as shown in FIG. 3, a band-shaped separating member 152 can be formed along the peripheral of the first surface 111 or the photodiodes 142 to have a height greater than the thickness of the micro lenses 144, and a transparent substrate 154 can be disposed on the separating member 152.

Moreover, in an embodiment, after the color filter 142 and the micro lenses 144 are formed, as shown in FIG. 4, a transparent substrate can be formed by applying a flowable transparent substance, having a refractive index different from that of the micro lenses 144, onto the micro lenses 144.

Also, in an embodiment, before or after the through-electrodes are formed in the second semiconductor chip, passive elements such as transistors, diodes, inductors and resistors can be formed on the second semiconductor chip, and then the through-electrodes and the passive elements can be electrically connected together.

As is apparent from the above description, the present invention provides advantages in that, since a wiring layer is formed on a lower surface of a semiconductor chip formed with photodiodes and an upper surface of the semiconductor chip facing away from the lower surface is grinded in such a way as to expose the photodiodes, optical interference by the presence of the wiring layer is prevented. Also, since through-electrodes are formed in a separate semiconductor chip, damage to the semiconductor chip can be avoided when forming the through-electrodes.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a reverse image sensor module, comprising the steps of:
    forming a first semiconductor chip including one or more photodiodes disposed on a first surface of a first semiconductor chip body, a wiring layer disposed on a second surface of the first semiconductor chip body facing away from the first surface and having one or more wiring lines which are electrically connected to the one or more photodiodes and one or more pads which are electrically connected to the one or more wiring lines, and a first insulation layer covering the wiring layer;
    forming a second semiconductor chip including one or more through-electrodes formed in a second semiconductor chip body so as to correspond to the one or more pads and so as to pass through the second semiconductor chip body, and a second insulation layer formed between the one or more through-electrodes and the second semiconductor chip body and on a third surface of the second semiconductor chip body facing the second surface of the first semiconductor chip; and
    joining the first and second insulation layers together.

2. The method according to claim 1, wherein, in the step of forming the first and second insulation layers, the first and second insulation layers comprise any one of a silicon oxide layer and a polymer layer and are joined together through application of at least one of heat and pressure.

3. The method according to claim 1, wherein the step of forming the one or more through-electrodes comprises the steps of:
- defining one or more blind vias extending from the third surface of the second semiconductor chip body toward a fourth surface which faces away from the third surface;
- forming the second insulation layer on the third surface and on inner surfaces of the second semiconductor chip body which are created by defining the one or more blind vias; and
- forming the one or more through-electrodes containing a metal in the blind vias.

4. The method according to claim 3, wherein, after the step of joining the first and second semiconductor chips, the method further comprises the steps of:
- grinding the first semiconductor chip to expose the one or more photodiodes; and
- grinding the second semiconductor chip and exposing the through-electrodes.

5. The method according to claim 1, wherein the step of forming the one or more through-electrodes comprises the steps of:
- ion-implanting conductive impurities at a high doping concentration into the second semiconductor chip body at positions corresponding to the one or more pads;
- annealing the second semiconductor chip ion-implanted with the conductive impurities; and
- forming connection pads on both ends of the one or more through-electrodes containing the conductive impurities.

6. The method according to claim 1, further comprising the step of:
- forming one or more color filters on the first surface of the first semiconductor chip to cover the respective one or more photodiodes; and
- forming one or more micro lenses on the one or more color filters.

7. The method according to claim 6, further comprising the steps of:
- forming a band-shaped separating member over edges corresponding to the first surface to have a height greater than a thickness of the one or more micro lenses; and
- disposing a transparent substrate on the separating member.

8. The method according to claim 6, further comprising the step of:
- forming a transparent substrate using a flowable transparent substance which has a refractive index different from that of the one or more micro lenses, to cover the one or more color filters and the one or more micro lenses.

* * * * *